US007788547B1

United States Patent
Oliva et al.

(10) Patent No.: US 7,788,547 B1
(45) Date of Patent: Aug. 31, 2010

(54) SYSTEMS AND METHODS FOR GENERATION OF COMMUNICATION CHANNEL FAULT INFORMATION

(75) Inventors: Stephen A. Oliva, Leawood, KS (US); Douglas L. Richards, Stilwell, KS (US)

(73) Assignee: Sprint Communications Company L.P., Overland Park, KS (US)

(*) Notice: Subject to any disclaimer, the term of this patent is extended or adjusted under 35 U.S.C. 154(b) by 290 days.

(21) Appl. No.: 12/119,560

(22) Filed: May 13, 2008

(51) Int. Cl.
- G06F 11/00 (2006.01)
- H03M 13/00 (2006.01)
- H04L 1/18 (2006.01)
- H04W 4/00 (2009.01)
- H04B 10/08 (2006.01)
- H04B 17/00 (2006.01)
- H04N 1/00 (2006.01)

(52) U.S. Cl. .................. 714/704; 370/333; 398/27; 358/426.09; 714/701; 714/751

(58) Field of Classification Search ................ None
See application file for complete search history.

(56) References Cited

U.S. PATENT DOCUMENTS

| 6,570,682 | B2 | 5/2003 | Robinson et al. |
| 6,781,679 | B1 | 8/2004 | Richards et al. |
| 6,915,463 | B2 | 7/2005 | Vieregge et al. |
| 7,221,871 | B2 | 5/2007 | Richards et al. |
| 2002/0138796 | A1 | 9/2002 | Jacob |
| 2003/0067655 | A1 | 4/2003 | Pedersen et al. |
| 2004/0120706 | A1 | 6/2004 | Johnson et al. |
| 2004/0213361 | A1* | 10/2004 | Chen et al. ............ 375/340 |

OTHER PUBLICATIONS

Vladimir Chernyak, et al., "PMD-Induced Fluctuations of Bit-Error Rate in Optical Fiber Systems," Journal of Lightwave Technology, Apr. 2004, pp. 1155-1168, vol. 22, No. 4.
Peter J. Winzer, et al., "Coherent Crosstalk in Ultra-Dense WDM Systems," 2 pages, Bell Labs, Lucent Technologies, Inst. f. Nachrichtentechnik u. Hochfrequenztechnik, Holmdel, New Jersey, Wien, Austria.

* cited by examiner

Primary Examiner—Kevin L Ellis
Assistant Examiner—Guerrier Merant

(57) ABSTRACT

A method is provided for generating fault information associated with a communication channel. In the method, a time-varying error value associated with the communication channel is received. If the error value exceeds a first threshold, a first time value associated with the error value exceeding the first threshold is stored. If the error value then falls and remains below the first threshold for a first minimum time period before the error value exceeds and remains above a second threshold that is higher than the first threshold for a second minimum time period, the first time value is deleted; otherwise, a second time value associated with the error value exceeding the second threshold is stored. The fault information comprises the first time value and the second time value.

20 Claims, 9 Drawing Sheets

SYSTEMS AND METHODS FOR GENERATION OF COMMUNICATION CHANNEL FAULT INFORMATION

TECHNICAL BACKGROUND

Modern communication networks often provide one or more levels of error correction to correct many errors that inevitably occur in such networks. For example, most communication channels that transmit data in quantized bundles or "packets" of binary digits ("bits") add redundant information in the form of error correction codes to each packet at the transmission end of the channel. After transmission of the data packet over the channel, the receiving end employs the error correction codes to detect and correct one or more erroneous bits in the packet. This form of data correction in a communication network is often termed "forward error correction" (FEC).

The data correction capability of a FEC scheme typically is limited by the amount of error correction data employed in each packet, the mathematical algorithm used to detect and correct errors, and other factors. Thus, monitoring equipment is often utilized to detect when errors on a particular communication channel are approaching an uncorrectable level, and issue a fault notification in such cases. In response to such a fault, the communication system may then employ a redundant communication channel, either over the same physical route or an alternate path, as a replacement for the faulty channel.

In addition to replacing the channel, the operator of the communication network subsequently attempts to determine the cause of the errors on the faulty channel to implement any necessary repairs to render the channel usable once again. To this end, the monitoring equipment may utilize information relating to the fault notification for the channel to determine the source of the errors.

OVERVIEW

Discussed herein is a method for generating fault information associated with a communication channel. In the method, an error value associated with the communication is received, wherein the error value varies with time. If the error value exceeds a first threshold, a first time value associated with the error value exceeding the first threshold is stored. If the error value then falls and remains below the first threshold for a first minimum time period before the error value exceeds and remains above a higher second threshold for a second minimum time period, the first time value is deleted. Otherwise, a second time value associated with the error value exceeding the second threshold is stored. The fault information then comprises the first time value and the second time value. In another implementation, this method may be embodied as computer-executable instructions encoded on a computer-readable medium.

Also provided is a system for generating fault information associated with a communication channel. The system includes an interface, data storage, and control logic. The interface is configured to receive an error value associated with the communication, wherein the error value varies with time. The control logic is configured to store in the data storage a first time value associated with the error value exceeding a first threshold, in the case the error value exceeds the first threshold. If the error value then falls and remains below the first threshold for a first minimum time period before the error value exceeds and remains above a second threshold higher than the first threshold for a second minimum time period, the control logic deletes the first time value from the data storage; otherwise, the control logic stores in the data storage a second time value associated with the error value exceeding the second threshold. The fault information comprises the first time value and the second time value.

BRIEF DESCRIPTION OF THE DRAWINGS

Many aspects of the disclosure can be more readily understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
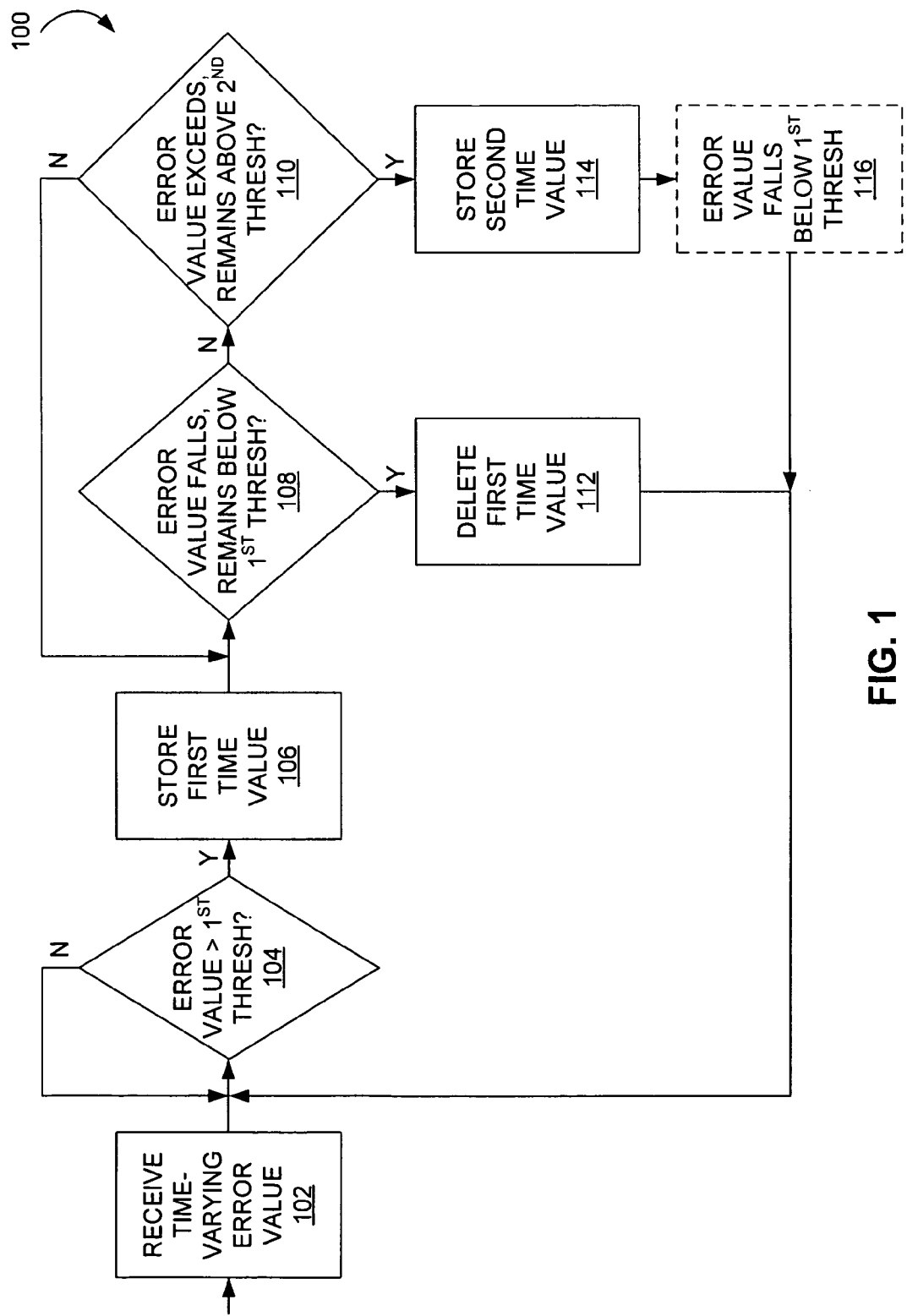
FIG. 1 is a flow diagram illustrating a method according to an embodiment of the invention for generating fault information associated with a communication channel.

FIG. 1 provides a flow diagram of a method 100 according to an embodiment of the invention for generating fault information associated with a communication channel. In the method 100, a time-varying error value associated with the communication channel is received (operation 102). In one embodiment, the error value is a pre-forward-error-correction (pre-FEC) bit-error rate (BER) for each of a number of data packets transmitted over the communication channel, although other measures of performance of the communication channel may be employed in other examples. If the error value exceeds a first threshold (operation 104), a first time value associated with the error value exceeding the first threshold is stored (operation 106). If the error value then falls and remains below the first threshold for a first minimum time period (operation 108) before the error value exceeds and remains above a second threshold higher than the first threshold for a second minimum time period (operation 110), then the first time value is deleted (operation 112). Otherwise (i.e., if the error value exceeds and remains above the second threshold for the second minimum time period before the error value falls and remains below the first threshold for the first minimum time period), a second time value associated with the error value exceeding the second threshold is stored (operation 114). For example, the second time value may indicate when the error value exceeded the second threshold. In another implementation, the second time value may denote when the error value has remained above the second threshold for some minimum period of time. The fault information includes the first time value and the second time value. Further, the error value may then fall below the first threshold (state 116) so that the method 100 may then return to checking if the error value again exceeds the first threshold (operation 104). In another implementation, the method 100 is encoded on a computer-readable medium as instructions for executing the operations of FIG. 1 on a computer.

Figure 2:
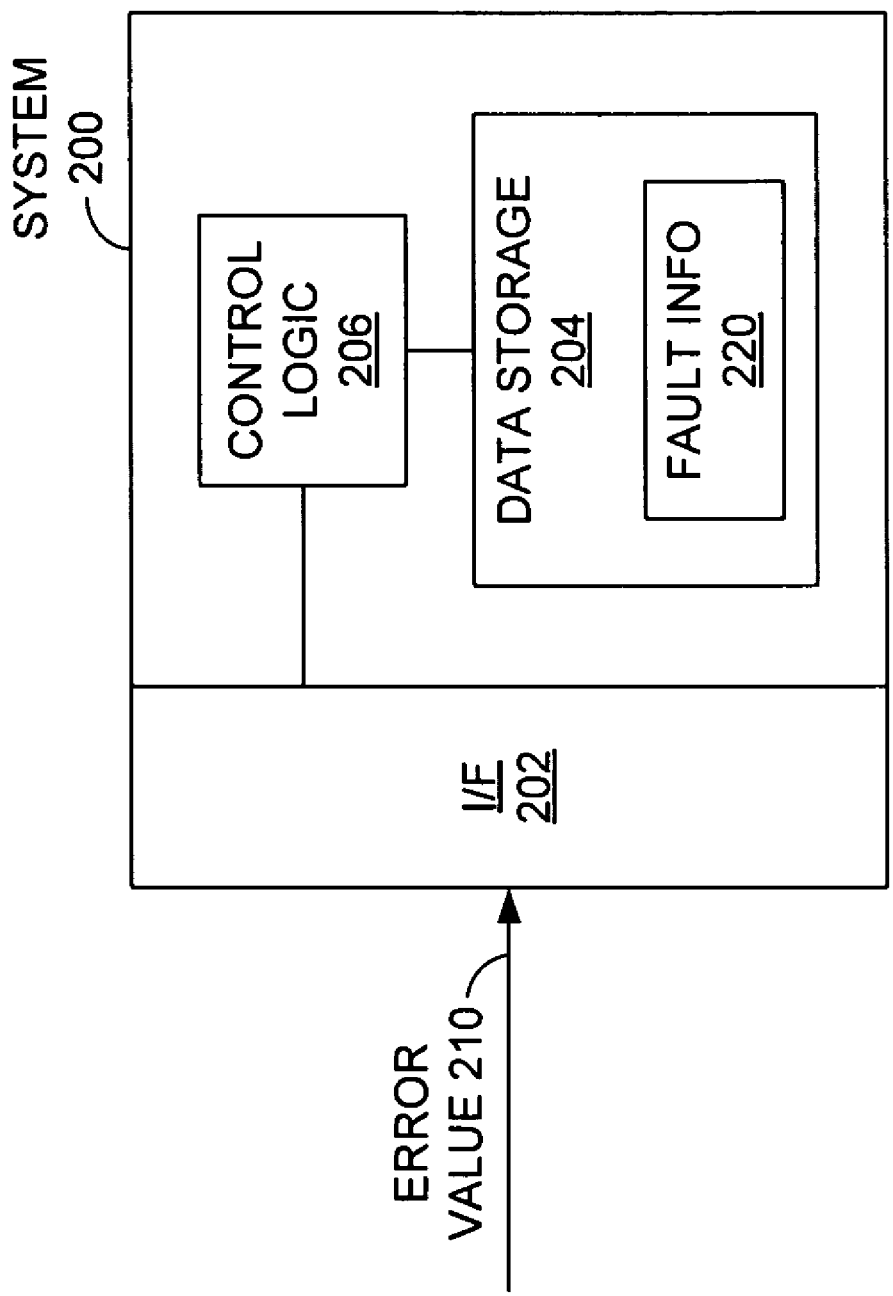
FIG. 2 is a block diagram of a system according to an embodiment of the invention for generating fault information associated with a communication channel.

FIG. 2 provides another example embodiment: a system 200 for generating fault information 220 associated with a communication channel. The system 200 includes an interface 202, data storage 204, and control logic 206. The interface 202 is configured to receive an error value 210, wherein the error value varies with time. The control logic is configured to process the error value 210 to generate the fault information 220. More specifically, if the error value 210 exceeds a first threshold, the control logic 206 stores in the data storage 204 a first time value associated with the error value exceeding the first threshold. If the error value then falls and remains below the first threshold for a first minimum time period before the error value exceeds and remains above a higher second threshold for a second minimum time period, the first time value is deleted from the data storage 204. Otherwise, the control logic 206 stores a second time value associated with the error value exceeding the second threshold in the data storage 204. The first and second time values constitute the fault information 220. The control logic 206 may then wait for the error value 210 to fall below the first threshold so that the error value 210 may then again be compared with the first threshold to begin storing more fault information 220 in the data storage 204.

Figure 3:
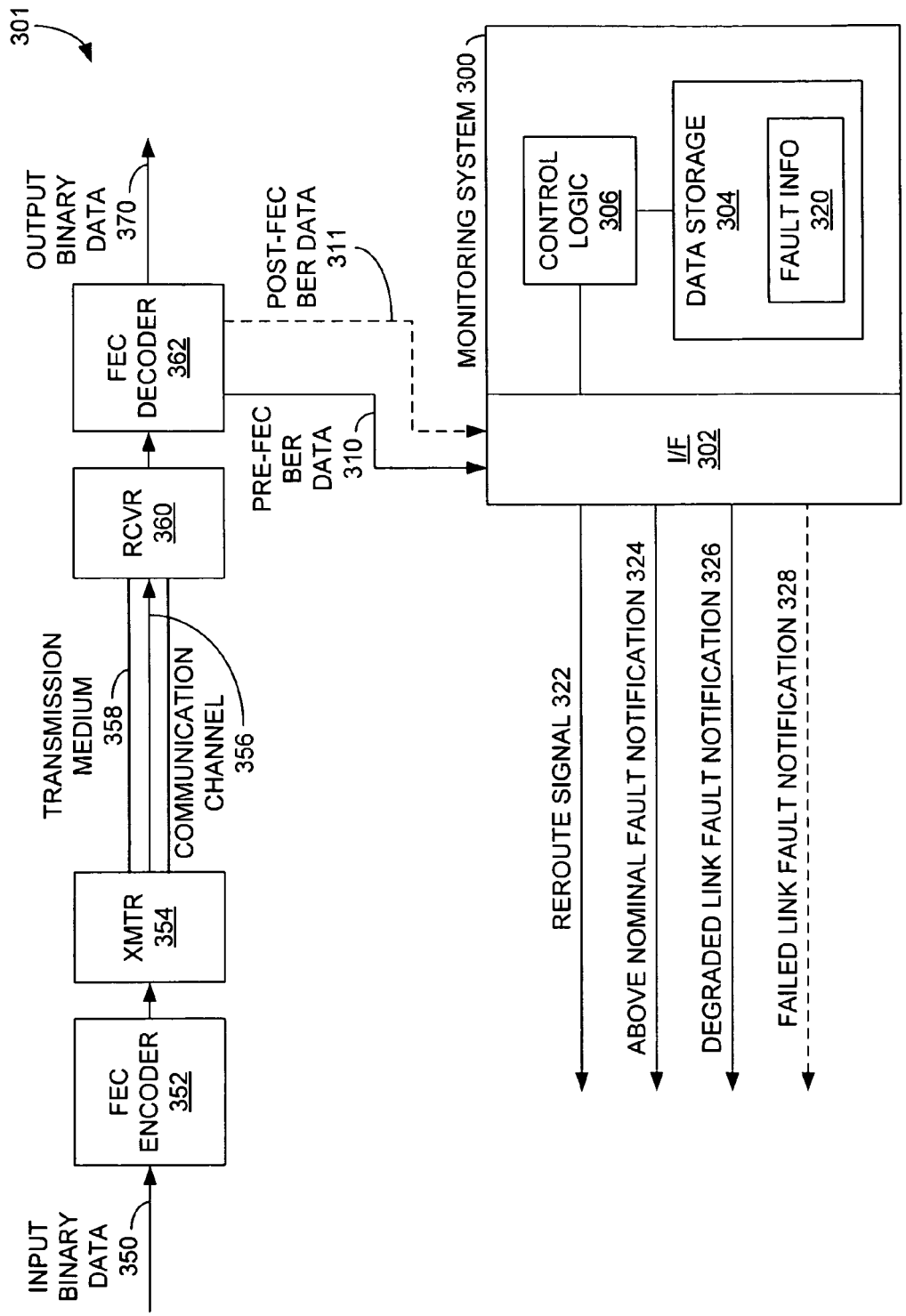
FIG. 3 is a simplified block diagram of a communication network employing a monitoring system according to an embodiment of the invention for generating fault information associated with a communication channel.

In another embodiment depicted in FIG. 3, a monitoring system 300 for generating fault information associated with a communication channel 356 resides within a communication network 301. The communication system 301 includes a transmission medium 358 capable of carrying the communication channel 356. In the specific embodiment of FIG. 3, the transmission medium 358 is an optical fiber over which one or more wavelength-division-multiplexing (WDM) communication channels, such as the channel 356, may be carried. Also, the data traffic carried over the communication channel 356, denoted as input binary data 350, is organized into packets of data bits or bytes. However, other communication technologies, such as any wireline or wireless communication technology, as well as other data organizations or protocols, may be employed in other implementations.

The input binary data 350, generated by a communication source (not depicted in FIG. 3) is transferred to an FEC encoder 352, which is configured to generate error correction data for the input binary data 350 and incorporate the error correction data into the input binary data 350 before passing the data 350 to a transmitter 354, such as an optical transmitter. In turn, the transmitter 354 is configured to transmit the data 350 over the communication channel 356 of the transmission medium 358. In the case of optical communications, the transmitter 354 converts the electrical data 350 into an optical format before transmitting the data 350 over the transmission medium 358.

At the opposing end of the transmission medium 358 is a receiver 360, such as an optical receiver, that performs any conversion necessary to the received data before passing the data to an FEC decoder 362. The FEC decoder 362 then processes the received data, including the enclosed error correction data, to detect and correct errors up to limits associated with the algorithm and the amount of error correction data supplied. The resulting output binary data 370 is then transferred by the FEC decoder 362 to a destination (not shown in FIG. 3).

The communication network 301 may include other devices, such as routers, amplifiers, repeaters, optical add/drop multiplexers (OADMs), and other components not specifically displayed in FIG. 3 to simplify the following discussion. The communication network 301 may also include one or more administrative or management systems not shown in FIG. 3 for managing the operation of the network.

Also shown in FIG. 3 is a monitoring system 300 coupled with the FEC decoder 362. Generally, the monitoring system 300 generates fault information based upon a time-varying error value associated with the data being transferred over the communication channel 356. In the specific case of FIG. 3, the error value is a series of distinct pre-FEC bit-error rate (BER) data values 310 received from the FEC decoder 362, with each data value 310 being associated with a single data packet transmitted over the communication channel 356. The FEC decoder 362 generates each pre-FEC BER data value 310 by detecting or calculating the uncorrected or "raw" BER of each packet of the received data before the data is corrected by the FEC decoder 362 using the error correction data incorporated in the received data. In other embodiments, different measures or values indicative of the number of errors in the data at the receiving end of the communication channel 356, such as Q-value or Q-margin parameters derived at least partially from the pre-FEC BER, may be employed.

The monitoring system 300 includes an interface 302, data storage 304, and control logic 306. The interface 302 is configured to receive at least pre-FEC BER data from the FEC decoder 362. In one implementation, the interface 302 may also be configured to receive post-FEC BER data 311 from FEC decoder 362, thus indicating whether any errors in the output binary data 370 were uncorrectable.

In the embodiment of FIG. 3, the interface is also configured to transmit signals to a network management system (not shown in FIG. 3) of the communication network 301. Such signals may include a reroute signal 322 indicating that the data traffic carried over the communication channel 356 should be transported over another communication channel. Other signals may include an above-nominal fault notification 324, a degraded link fault notification 326, and a failed link notification 328. These signals are described in greater detail below in conjunction with the operation of the control logic 306.

The control logic 306 processes the pre-FEC BER data 310 received over the interface 302 to generate and store fault information 320 in the data storage 304. As is described further below, the fault information 320 may be analyzed to determine the source or cause of data errors detected in the data traffic transmitted over the communication channel 356. Further, the fault information 320 may be transferred as part of one or more of the signals 322-328 generated by the control logic 306 and transferred over the interface 302.

In one implementation, the control logic 306 may be a microprocessor, microcontroller, or other processor configured to execute software or firmware instructions for performing the various tasks described below. In other embodiments, the control logic 306 may be a hardware logic circuit, or a combination of processor, software or firmware, and hardware circuit elements configured to perform the various functions discussed below in conjunction with the control logic 306.

Figure 4A:
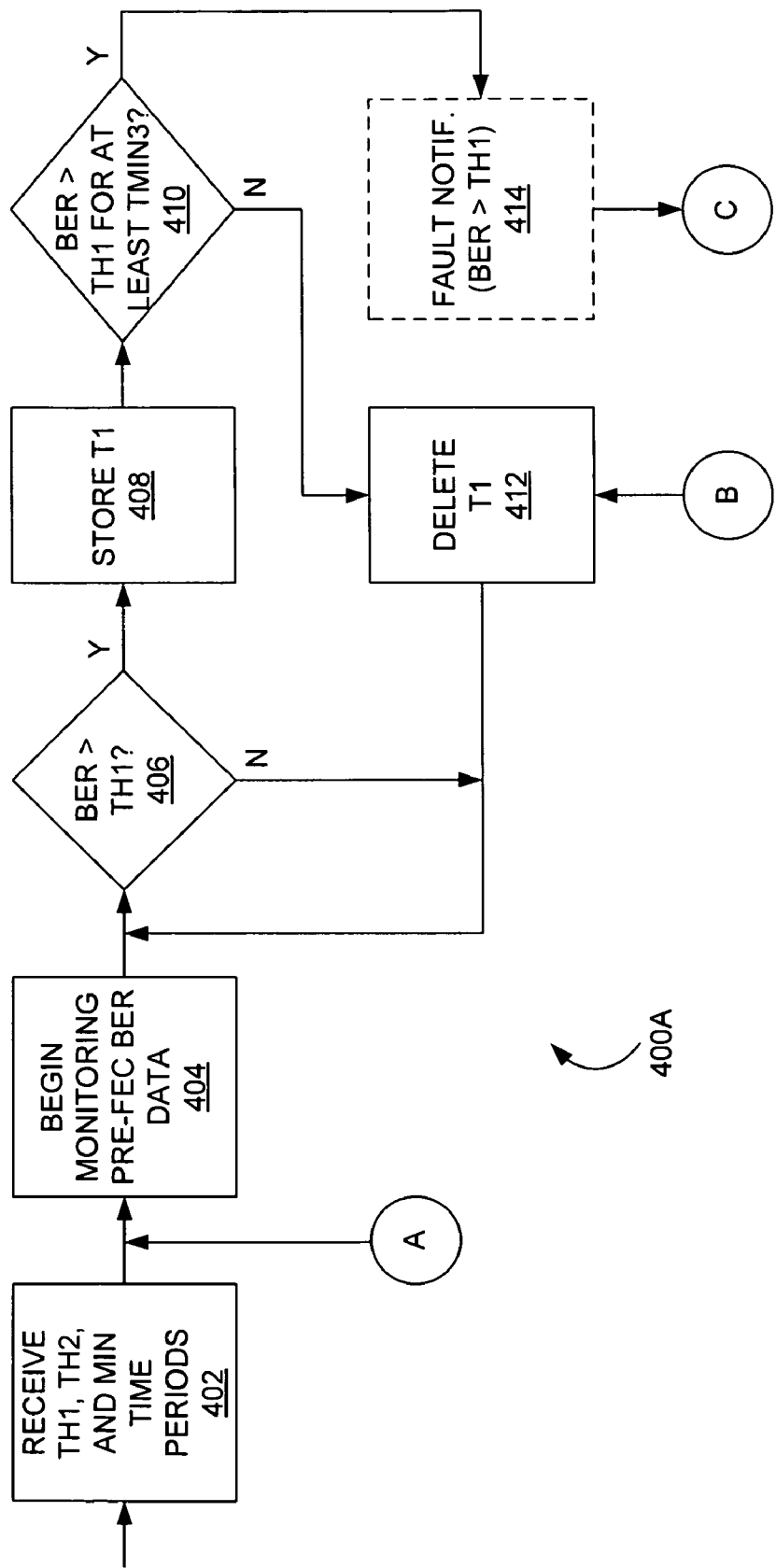
FIGS. 4A and 4B illustrate a flow diagram of a method for operating the monitoring system of FIG. 3 according to an embodiment of the invention.
Figure 4B:
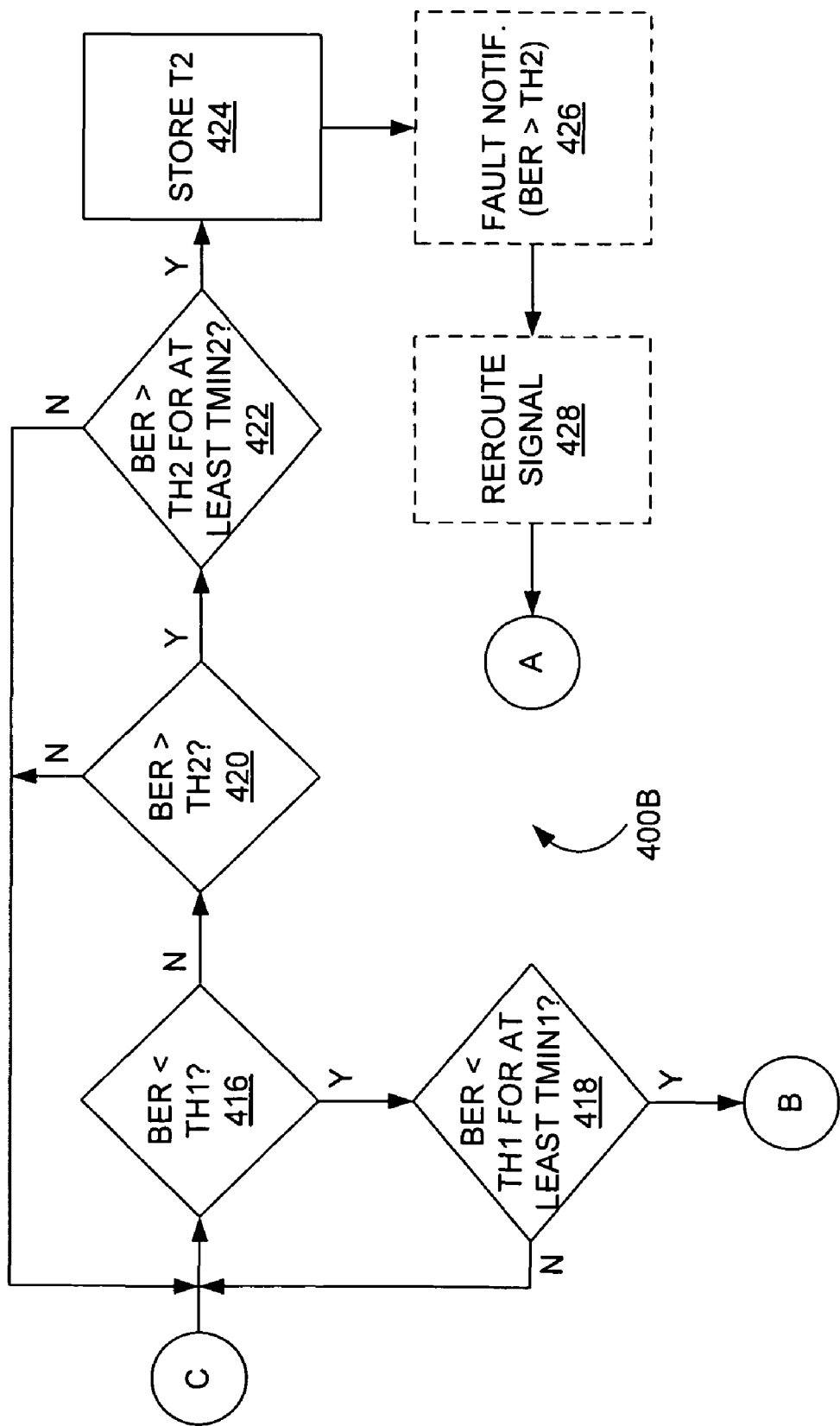

FIGS. 4A and 4B together present a flow diagram summarizing a method 400 of operating a monitoring system, such as the monitoring system 300 of FIG. 3, according to one embodiment. While the following discussion specifically references the monitoring system 300 and the control logic 306 residing therein, other systems or devices may be utilized to execute the operations of FIGS. 4A and 4B.

In the method 400, the control logic 402 may receive several constants employed in processing the pre-FEC BER data 310 to generate the fault information 320 (operation 402). These constants include a first threshold TH1 and a second threshold TH2 for the pre-FEC BER data 310. The second threshold TH2 is higher than the first threshold TH1. Also, both the first threshold TH1 and the second threshold TH2 are both lower than a level of pre-FEC BER at which the data being transferred over the communication channel 356 becomes uncorrectable by the FEC decoder 362. In one embodiment, the first threshold TH1 is associated with a level of errors considered to be above a nominal operating state. Correspondingly, the higher second threshold TH2 may be associated with an error level at which the communication channel 356 has become significantly degraded, and thus possibly prompting a rerouting of the traffic from the monitored communication channel 356 to another communication channel. In one implementation, each of the thresholds TH1, TH2 may be specified as a specific value, as a percentage of the error rate associated with an uncorrectable error level, or by some other method.

The control logic 306 may also receive several minimum time periods to process the pre-FEC BER data 310. These minimum time periods may provide a kind of buffering of the pre-FEC BER data 310 in determining whether the pre-FEC BER data 310 has exceeded or fallen below a particular threshold TH1, TH2. In the example described in FIG. 4, a first minimum time period TMIN1 is a minimum time for which the pre-FEC BER data 310 must remain below the first threshold TH1 to register as being below the first threshold TH1 after rising above the first threshold TH1. Similarly, a second minimum time period TMIN2 is the minimum time for which the pre-FEC BER data 310 must remain above the second threshold TH2 before the data 310 is registered as exceeding the second threshold TH2. Further, a third minimum time period TMIN3 is the minimum time period associated with the pre-FEC BER data 310 remaining above the first threshold TH1.

In one example, each of the minimum time periods TMIN1-TMIN3 may be any time period considered sufficient for accepting or registering the related threshold crossing, such as a number of milliseconds, seconds, minutes, or the like. Such a value may be based in part on the data rate of the communication channel 356, the technical characteristics of the transmission channel 356, and other factors.

The control logic 306 may receive the thresholds TH1, TH2 and the minimum time periods TMIN1-TMIN3 from a source external to the monitoring system 302, such as a management system, by way of the interface 302. In other examples, the control logic 306 may receive this information from a human operator over a user interface (not shown in FIG. 3) of the monitoring system 300. Alternatively, this information may have been previously encoded into the functionality of the control logic 306.

After the thresholds TH1, TH2 and the minimum time periods TMIN1-TMIN4 are available to the control logic 306 by way of the interface 302, the control logic 306 may then begin monitoring the pre-FEC BER data values 310 received from the FEC decoder 362 (operation 404). In one example, the FEC decoder 362 transfers each pre-FEC BER value 310 to the interface 302 of the monitoring system 300 immediately after it is generated for a particular received packet. In other examples, some delay between generation of the values 310 and their transmission to the interface 302 may be involved. The pre-FEC BER data 310 are then passed to the control logic 306 for processing.

Presuming the pre-FEC BER data 310 initially indicates a BER below the first threshold TH1, the control logic 306 continuously monitors the data 310 to detect if the data 310 exceeds the first threshold TH1 (operation 406). The control logic 306 continues to monitor for that event until the data 310 exceeds the first threshold TH1, at which point the control logic 306 stores in the data storage 304 a first time value T1 associated with the pre-FEC BER exceeding the first threshold TH1 (operation 408). The first time value T1, as well as other time values stored in the data storage 304, may be a time stamp, one of a series of sequential numerical values, or any other value indicating a relative point in time of a specific event.

After the pre-FEC BER data 310 exceeds the first threshold TH1, the control logic continues to monitor the pre-FEC BER data 310 to determine if the data 310 remains above the first threshold TH1 for the third minimum time period TMIN3 (operation 410). In one implementation, the timing of the third minimum time period TMIN3 may be employed via a hardware or software count-up or countdown timer within the control logic 306 that is initiated upon the pre-FEC BER data 310 exceeding the first threshold, and is configured to issue an interrupt or other indication upon expiration of the timer. If the pre-FEC BER data 310 falls below the first threshold TH1 before the third minimum time period TMIN3 elapses, the control logic 306 deletes the first time value T1 from the data storage 304 (operation 412), and then begins to monitor the pre-FEC BER data 310 to determine if the data 310 again exceeds the first threshold TH1 (operation 406).

Otherwise, if the pre-FEC BER data 310 remains above the first threshold TH1 for at least the third minimum time period TMIN3 (operation 410), the control logic 306 may be configured to generate a fault notification indicating the pre-FEC BER of the communication channel 356 is above nominal (operation 414). The fault notification may be embodied in an "above nominal" signal 324 issued by the control logic 306 through the interface 302 to a network management system (not shown in FIG. 3).

After the control logic 306 issues the above-nominal fault notification 324, the control logic 306 continues to monitor the pre-FEC BER data 310 to determine if the data 310 either falls below the first threshold TH1 (operation 416 of FIG. 4B) or rises above the second threshold TH2 (operation 420). If the error data 310 falls below the first threshold TH1 (operation 416), the control logic 306 continues to monitor the data 310 to determine if the data 310 remains below the first threshold TH1 for at least the first minimum time period TMIN1 (operation 418). If the pre-FEC BER data 310 remains below the first threshold for the first minimum time period TMIN1, the control logic 306 deletes the previously-stored first time value T1 from the data storage 304 (operation 412), and then monitors the data 310 to detect if the data 310 once again exceeds the first threshold TH1 (operation 406). If, instead, the pre-FEC BER data 310 does not remain below the first threshold TH1 for the first minimum time period TMIN1, the control logic 306 again monitors the data 310 to determine if the data 310 either falls below the first threshold TH1 (operation 416) or rises above the second threshold TH2 (operation 420).

If the control logic determines at this point that the pre-FEC BER data 310 exceeds the second threshold TH2 (operation 420), the control logic 306 continues to monitor the data 310 to determine if the data 310 remains above the second threshold TH2 for the second minimum time period TMIN2 (operation 422). If not, the control logic 306 again tracks the data 310 to detect if the data 310 falls below the first threshold TH1 (operation 416) or exceeds the second threshold (operation 420).

If, instead, the control logic 306 has determined that the pre-FEC BER data 310 has remained above the second threshold TH2 for at least the second minimum time period TMIN2 (operation 422), the control logic 306 stores a second time value T2 associated with the time at which the data 310 has remained above the second threshold TH2 continuously (operation 424). In another embodiment, the second time value T2 may represent the point at which the data 310 most recently rose above the second threshold TH2.

In response to the error data 310 remaining above the second threshold TH2 for at least the second minimum time period TMIN2 (operation 422), the control logic 306 may also issue a second fault notification (operation 426). More specifically, the control logic 306 may issue via the interface 302 a signal representing a "degraded" link or "critical" fault notification 326 to a network management system. In addition, the control logic 306 may also issue a rerouting signal 322 to the network management system, thus causing the traffic over the monitored communication channel 356 to be placed on another communication channel, carried either by the same transmission medium 358 or another transmission medium not depicted in FIG. 3. After such rerouting occurs, the control logic 306 may then begin monitoring pre-FEC BER data associated with the new communication channel (operation 404).

Further, the control logic 306 may transfer any or all of the first time value T1, the second time value T2, and a difference between the first time value T1 and the second time value T2 stored in the data storage 304. In one example, this information may be supplied with the critical fault notification 326 or the rerouting signal 322. This information regarding T1 and T2 may be employed to determine a likely source or cause of the degraded link fault notification. For example, a relatively small difference between the first time value T1 and the second time value T2 may indicate a "hard," or catastrophic, fault condition, such as the transmission medium 358 being cut, or a transmission laser of the transmitter 354 becoming defective. Such a hard fault condition would likely result in the pre-FEC BER data 310 quickly transitioning from operating at a nominal level to a critical level within a relatively short time period. Oppositely, a large time differential between the first time value T1 and the second time value T2 may indicate a slow degradation of the quality of the communication channel 356, such as that associated with polarization mode distortion (PMD) or coherent crosstalk of adjacent channels of an optical communication system.

In one embodiment, the control logic 306 may also issue a "failed" notification signal 328 to a network management system in response to the pre-FEC BER data 310 exceeding an uncorrectable error level. Alternately, this information may be gleaned from post-FEC BER data 311 transferred from the FEC decoder 362 via the interface 302 to the control logic 306.

Figure 5:
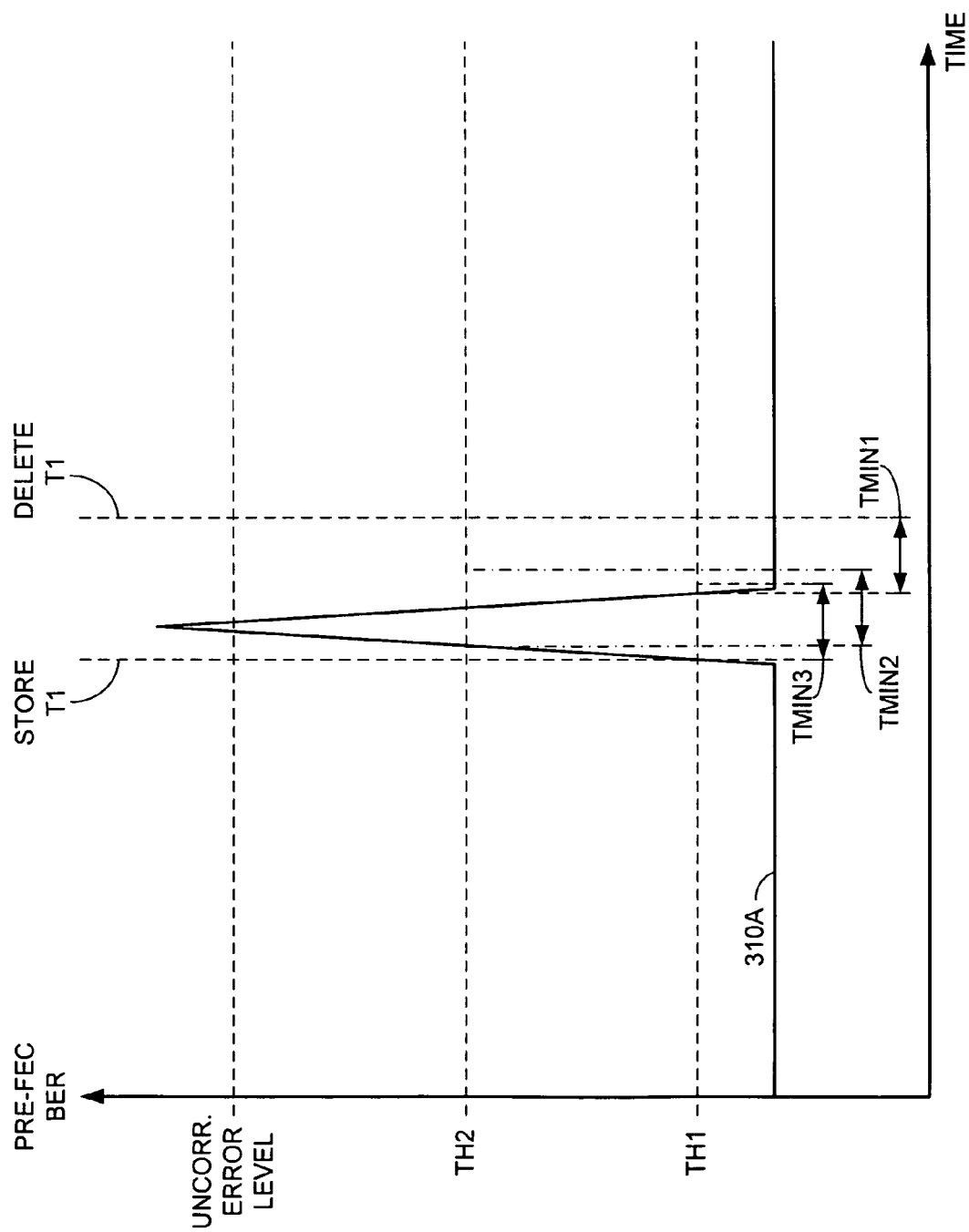
FIG. 5 is a timing diagram of pre-FEC bit-error rates indicating a short error event on a communication channel not resulting in a fault notification according to an embodiment of the invention.
Figure 6:
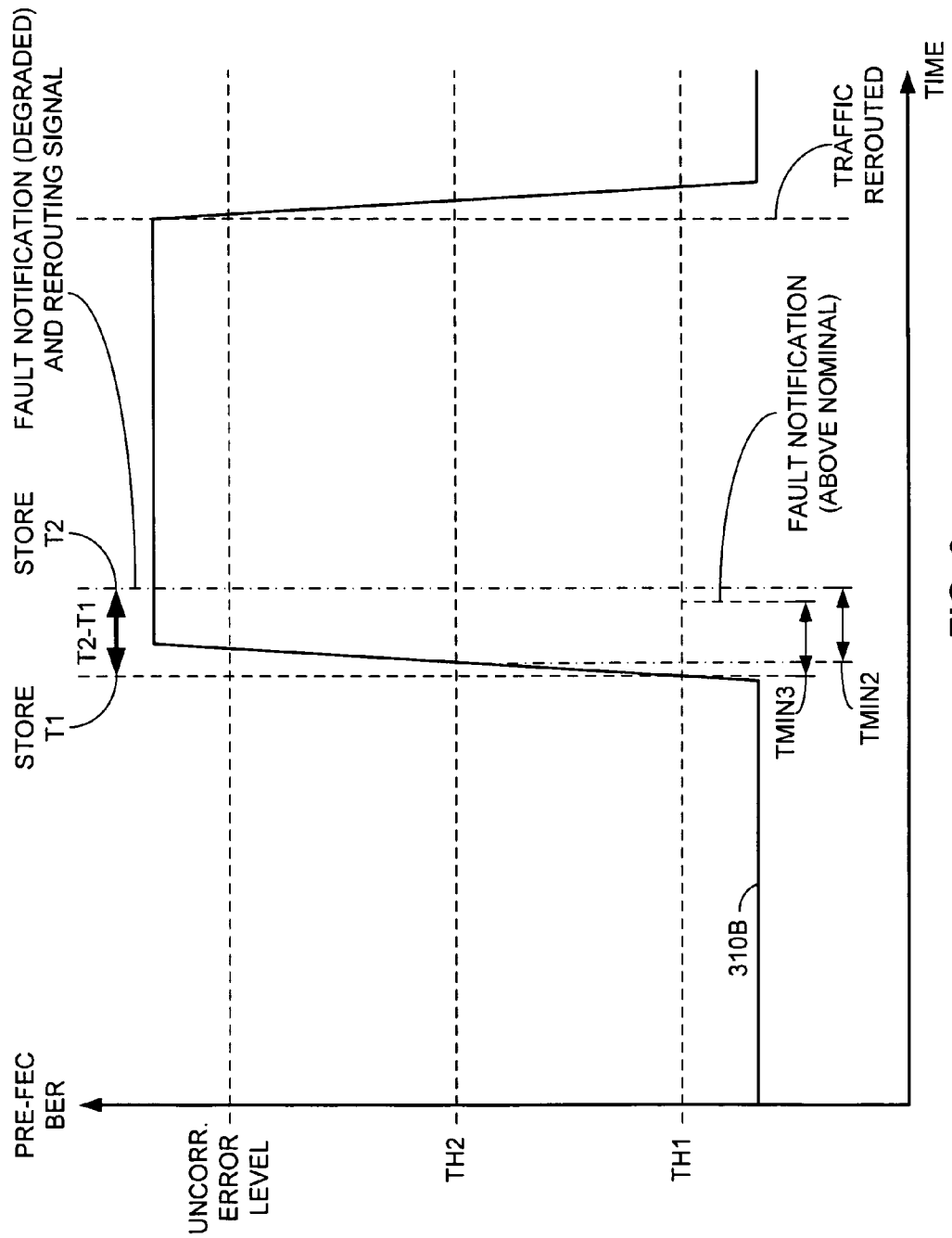
FIG. 6 is a timing diagram of pre-FEC bit-error rates indicating a hard fault condition on a communication channel according to an embodiment of the invention.
Figure 7:
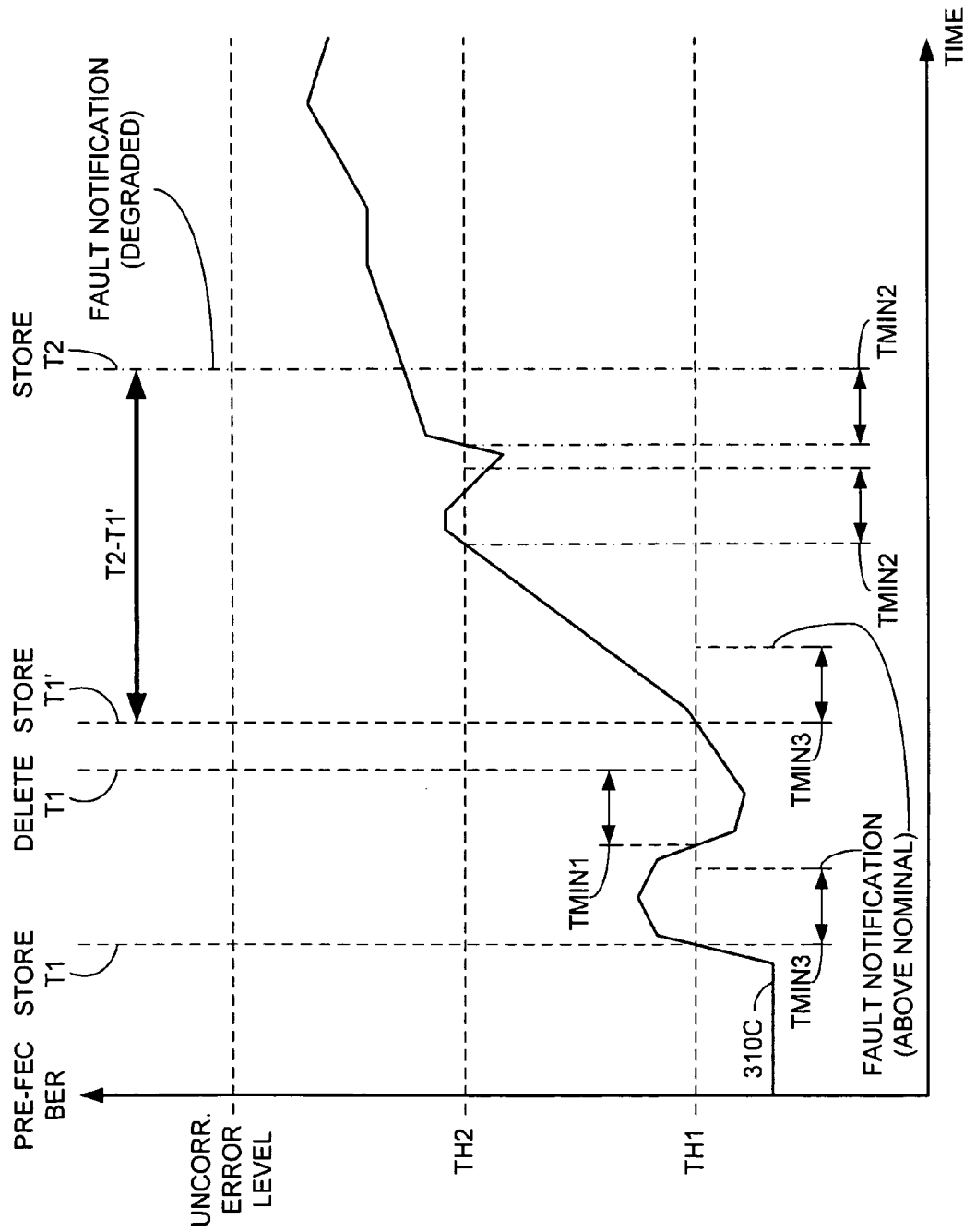
FIG. 7 is a timing diagram of pre-FEC bit-error rates indicating a soft fault condition on a communication channel according to an embodiment of the invention.

FIGS. 5-7 provide timing diagrams of varying profiles of possible pre-FEC BER data 310, with the response of the monitoring system 300 indicated thereon. In each of the FIGS. 5-7, three separate thresholds for the pre-FEC BER data 310 are displayed: the first threshold TH1, the second threshold TH2 greater than the first threshold TH1, and an uncorrectable error level greater than the first two thresholds TH1, TH2, as described above. In one implementation, the first threshold TH1 may be identified with a level at which the pre-FEC BER level is not considered nominal, while the second threshold TH2 may indicate a level at which the operation of the associated communication channel 356 is considered to be degraded. The actual threshold levels TH1, TH2 may be based on the uncorrectable error level, the typical characteristics of the communication channel 356 and its associated transmission medium 358, and/or other criteria.

In the example of FIG. 5, pre-FEC BER data 310A remains below the first threshold TH1 until the data 310A crosses the first threshold TH1 at a time value T1, at which point the time value T1 is stored. The monitored pre-FEC BER data 310A shortly thereafter surpasses the second threshold TH2 and the uncorrectable error level before quickly falling back below the first threshold TH1. More specifically, the pre-FEC BER data 310A falls and remains below the first threshold TH2 for the first minimum time period TMIN1 before exceeding and remaining above the second threshold TH2 for the second minimum time period TMIN2, as shown in FIG. 5, thus causing the time value T1 to be deleted upon expiration of the first minimum time period TMIN1. Moreover, since the pre-FEC BER data 310A does not remain above the first threshold TH1 for the third minimum time period TMIN3, and does not remain above the second threshold TH2 for the second minimum time period TMIN2, the monitoring system 300 does not issue any fault notifications or rerouting signals.

FIG. 6 provides an example of the communication channel 356 quickly attaining and maintaining a high level of errors, as indicated by pre-FEC BER data 310B. More specifically, the monitored data 310B exceeds the first threshold TH1 at a time value T1, upon which the time value T1 is stored. The pre-FEC BER data 310B further increases beyond the second threshold TH2 and the uncorrectable error level shortly thereafter, and then remains at that elevated level until the monitoring system 300 acts. After the monitored data 310B has remained above the first threshold TH1 for the third minimum time period TMIN3, the control logic 306 of the monitoring system 300 issues a fault notification indicating an above-nominal condition.

Subsequently in FIG. 6, once the pre-FEC BER data 310B has remained higher than the second threshold TH2 for the second minimum time period TMIN2, the control logic 306 stores a second time value T2 associated with the end of the minimum time period TMIN2. In another embodiment, the second stored time value T2 may instead be associated with the time at which the pre-FEC BER data 310B exceeds the second threshold TH2. In addition, when the monitored error data 3100B has remained higher than the second threshold for the second minimum time period TMIN2, the control logic 306 may issue a second fault notification indicating a degraded or critical communication channel 356 condition.

Also at this time, the control logic 306 may issue a rerouting signal to a network management system to reroute the traffic using the degraded communication channel 356 to another communication channel. Presumably, after the network management system has rerouted the traffic, the monitored pre-FEC BER data 310B then returns to a nominal state (i.e., below the first threshold TH1).

In the example of FIG. 6, the relatively small difference between the first time value T1 associated with the first threshold TH1 and the second time value T2 related to the second threshold TH2, as indicated by the bold arrow T2-T1, indicates that the transition from a nominal performance state to a significantly degraded state was relatively rapid, indicative of a "hard" fault condition, such as a damaged transmission medium 358, a failed transmitter or receiver component, or the like.

FIG. 7 depicts a contrasting scenario under which monitored pre-FEC BER data 310C increases relatively slowly over a period of time. In this example, the data 310C increases beyond the first threshold TH1, at which point the control logic 306 stores a first time value T1. The error data 310C then remains above the first threshold TH1 for longer than the third minimum time period TMIN3 before falling below the first threshold TH1, to which the control logic 306 responds by issuing an above-nominal fault notification. The error data 310C then falls below the first threshold TH1 for longer than the first minimum time period TMIN 1, causing the control logic 306 to delete the previously stored first time value T1. In another example, if the error data 310C had not remained above the first threshold TH1 for at least the third minimum time period TMIN3, the control logic 306 would have deleted the first time value T1 shortly after the error data 310C fell below the first threshold TH1, and would not have issued a fault notification at that point.

After the first above-nominal fault notification, the error data 310C falls below the first threshold TH1, and then increases again above the first threshold TH1, in response to which the control logic 306 stores a new first time value T1' identified with the data 310C crossing the first threshold TH1. Again, the error data 310C remains above the first threshold TH1 for at least the third minimum time period TMIN3, resulting in the control logic 306 issuing a second above-nominal fault notification.

From this point, the pre-FEC BER data 310C generally increases until it surpasses the second threshold TH2, after which the data 310C falls below the second threshold TH2 before the second minimum time period TMIN2 has elapsed, thus preventing the generation of a degraded fault notification for the time being. The error data 310C thereafter increases again above the second threshold TH2 and remains thereabove for the second minimum time period TMIN2, resulting in the control logic 306 storing a second time value T2 at that point. Under these circumstances, the control logic 306 may also issue a fault notification signifying a degraded or critical error condition for the communication channel 356, possibly along with a rerouting signal.

The slower overall increase in the pre-FEC BER data 310C in FIG. 7, as indicated by the greater difference between the first time value T1' and the second time value T2 compared to that generated in the example of FIG. 6, may thus indicate a "soft" fault condition, such as what may be caused by polarization mode distortion or coherent crosstalk often experienced in optical communication channels. In one embodiment, the control logic 306 may distinguish between soft and hard fault conditions by way of a predetermined time limit, so that differences between the first and second saved time values that exceed the time limit may indicate a soft fault condition, while time differences falling below the time limit may denote a hard fault condition. In one example, the time limit may be on the order of tens or hundreds of milliseconds.

In another implementation, instead of storing the second time value T2 after the error data 310C has remained above the second threshold TH2 for the second minimum time period TMIN2, the second time value T2 may be stored at the point at which the error data 310C first exceeds the second threshold TH2. In that case, if the error data 310C falls below the second threshold TH2 before the second minimum time period TMIN2, and then remains below the second threshold TH2 for at least a fourth minimum time period (not shown in FIG. 7), the control logic 306 may then delete the second time value T2 and wait for the error data 310C to rise above the second threshold TH2 once again before storing a new second time value T2.

Figure 8:
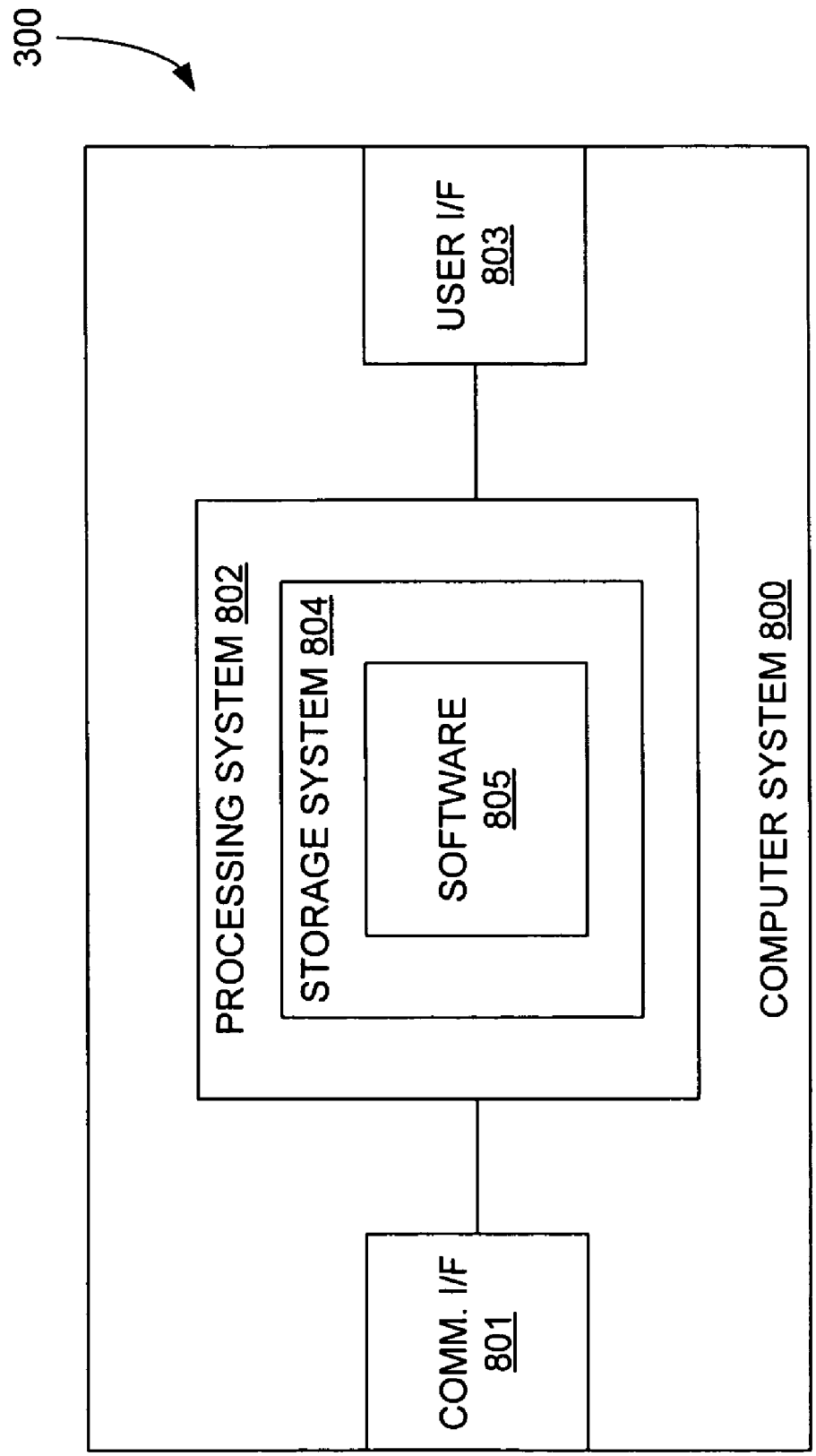
FIG. 8 is a block diagram of a monitoring system for generating fault information associated with a communication channel according to another embodiment of the invention.

In one example, the monitoring system 300 may be a computer system 800, as depicted in FIG. 8. In one example, the computer system 800 includes a communication interface 801, a processing system 802, and a user interface 803. The processing system 802 includes a storage system 804. The storage system 804 stores software 805, and may also serve as the storage system 304 of FIG. 3. The processing system 802 is linked to the communication interface 801 and the user interface 803. The computer system 800 may include a programmed general-purpose computer, although those skilled in the art will appreciate that programmable or special purpose circuitry and equipment may be used. The computer system 800 may be distributed among multiple devices that together constitute elements 801-805.

More specifically, the communication interface 801 could include a network interface, modem, port, transceiver, or some other communication device. The communication interface 801 may serve as the interface 302 depicted in FIG. 3. The communication interface 501 may be distributed among multiple communication devices. The processing system 802 could include a computer microprocessor, logic circuit, or some other processing device. Also, the processing system 802 may be distributed among multiple processing devices. The user interface 803 could include a keyboard, mouse, voice recognition interface, microphone and speakers, graphical display, touch screen, or some other type of user device. The user interface 803 may be distributed among multiple user devices. The storage system 804 could include a disk, tape, integrated circuit, server, or some other memory device. The storage system 804 may be distributed among multiple memory devices.

The processing system 802, which may be employed as the control logic 306 of FIG. 3, retrieves and executes the software 805 from the storage system 804. The software 805 may include an operating system, utilities, drivers, networking software, and other software typically loaded onto a computer system. The software 805 could include an application program, firmware, or some other form of machine-readable processing instructions. When executed by the processing system 802, the software 805 may direct the processing system 802 to perform any of the operations described above, including those operations illustrated in FIGS. 1, 4A, and 4B. Further, the processing system may execute the operations depicted in FIGS. 1, 4A, and 4B in an order other than that shown explicitly in the Figures, including concurrent execution of one or more operations, while remaining with the scope of the invention.

Various embodiments as described above allow the generation of fault information capable of providing an indication as to the nature or severity of a fault condition of a communication channel, resulting in several potential advantages. For those hard faults that quickly approach a critical stage, as indicated by a short time period between two saved time values, immediate dispatch of service personnel may be required, as the hard fault may be associated with failed communication equipment or damaged transmission media in need of replacement. Otherwise, if the two saved values are separated by a relatively long time period, indicating a slow worsening of the error status of the associated communication channel, a soft fault condition may instead be indicated.

This soft fault condition, such as that related to PMD or coherent crosstalk, may not require immediate service attention. Thus, distinguishing between hard and soft error conditions in this manner may aid in making financially prudent decisions regarding the servicing and maintenance of communication equipment.

Further, various embodiments discussed herein allow such capability while requiring minimal amounts of storage (e.g., the storage of pairs of time values). Also, the detection of time-varying optical impairments, such as PMD and coherent crosstalk, which often affect multiple communication channels within a transmission medium, is facilitated by monitoring a single communication channel, rather than multiple communication channels on the same link. Such capability is advantageous in communication systems in which the monitoring of multiple communication channels in parallel at a single network terminal or other node is either inconvenient or impossible.

While much of the foregoing discussion focuses on optical communication networks, other communication technologies, such as wireline and wireless communication systems, may also benefit from application of various aspects of the systems and methods described herein.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method for generating fault information associated with a communication channel, the method comprising:
    receiving an error value associated with the communication channel, wherein the error value varies with time;
    if the error value exceeds a first threshold, storing a first time value associated with the error value exceeding the first threshold; and
    if the error value falls and remains below the first threshold for a first minimum time period before the error value exceeds and remains above a second threshold higher than the first threshold for a second minimum time period, deleting the first time value;
    otherwise, storing a second time value associated with the error value exceeding the second threshold, wherein the fault information comprises the first time value and the second time value.

2. The method of claim 1, wherein the first threshold and the second threshold are lower than an uncorrectable error level for the communication channel.

3. The method of claim 1, further comprising:
    in response to storing the second time value, issuing a signal to reroute communication traffic of the communication channel over a second communication channel.

4. The method of claim 1, wherein the fault information indicates a hard fault condition if a difference between the first time value and the second time value is below a first time limit.

5. The method of claim 1, wherein the fault information indicates a soft fault condition if a difference between the first time value and the second time value is above a first time limit.

6. The method of claim 1, further comprising:
    if, after exceeding the first threshold, the error value remains above the first threshold for a third minimum time period, issuing a first fault notification.

7. The method of claim 1, further comprising:
    if, after exceeding the second threshold, the error value remains above the second threshold for the second minimum time period, issuing a second fault notification.

8. The method of claim 1, wherein the first time value comprises a time value at which the error value exceeds the first threshold.

9. The method of claim 1, wherein the second time value comprises a time value at which the error value remains above the second threshold for the second minimum time period.

10. The method of claim 1, wherein the error value comprises one of a bit-error rate before forward error correction, a Q-value, and a Q-margin.

11. The method of claim 1, wherein the communication channel comprises an optical communication channel.

12. A computer-readable medium comprising instructions encoded thereon for executing a method for generating fault information associated with a communication channel, the method comprising:
    receiving an error value associated with the communication channel, wherein the error value varies with time;
    if the error value exceeds a first threshold, storing a first time value associated with the error value exceeding the first threshold; and
    if the error value falls and remains below the first threshold for a first minimum time period before the error value exceeds and remains above a second threshold higher than the first threshold for a second minimum time period, deleting the first time value;
    otherwise, storing a second time value associated with the error value exceeding the second threshold, wherein the fault information comprises the first time value and the second time value.

13. A system for generating fault information associated with a communication channel, the system comprising:
    an interface configured to receive an error value associated with the communication channel, wherein the error value varies with time;
    data storage; and
    control logic configured to:
        if the error value exceeds a first threshold, store in the data storage a first time value associated with the error value exceeding the first threshold; and
        if the error value falls and remains below the first threshold for a first minimum time period before the error value exceeds and remains above a second threshold higher than the first threshold for a second minimum time period, delete the first time value from the data storage;
        otherwise, store in the data storage a second time value associated with the error value exceeding the second threshold, wherein the fault information comprises the first time value and the second time value.

14. The system of claim 13, wherein the control logic is further configured to:
    in response to the storing the second time value, issue a signal by way of the interface to reroute communication traffic of the communication channel over a second communication channel.

15. The system of claim 13, wherein the fault information indicates a hard fault condition if a difference between the first time value and the second time value is below a first time limit.

16. The system of claim 13, wherein the fault information indicates a soft fault condition if a difference between the first time value and the second time value is above a first time limit.

17. The system of claim 13, wherein the control logic is further configured to:
   if, after exceeding the first threshold, the error value remains above the first threshold for a third minimum time period, issue a first fault notification via the interface.

18. The system of claim 13, wherein the control logic is further configured to:
   if, after exceeding the second threshold, the error value remains above the second threshold for the second minimum time period, issue a second fault notification via the interface.

19. The system of claim 13, wherein the first time value comprises a time value associated with the error value exceeding the first threshold.

20. The system of claim 13, wherein the second time value comprises a time value associated with the error value remaining above the second threshold for the second minimum time period.

* * * * *